(12) United States Patent
Akiyama et al.

(10) Patent No.: US 9,583,270 B2
(45) Date of Patent: Feb. 28, 2017

(54) COMPLEX OXIDE, THIN-FILM CAPACITIVE ELEMENT, LIQUID DROPLET DISCHARGE HEAD, AND METHOD OF PRODUCING COMPLEX OXIDE

(71) Applicants: Yoshikazu Akiyama, Kanagawa (JP); Xianfeng Chen, Kanagawa (JP)

(72) Inventors: Yoshikazu Akiyama, Kanagawa (JP); Xianfeng Chen, Kanagawa (JP)

(73) Assignee: Ricoh Company, Ltd., Tokyo (JP)

( * ) Notice: Subject to any disclaimer, the term of this patent is extended or adjusted under 35 U.S.C. 154(b) by 348 days.

(21) Appl. No.: 14/183,707

(22) Filed: Feb. 19, 2014

(65) Prior Publication Data
US 2014/0268481 A1 Sep. 18, 2014

(30) Foreign Application Priority Data

Mar. 13, 2013 (JP) ................. 2013-050870

(51) Int. Cl.
| | |
|---|---|
| *H01L 41/09* | (2006.01) |
| *H01G 7/06* | (2006.01) |
| *H01L 41/08* | (2006.01) |
| *H01L 41/187* | (2006.01) |
| *H01L 41/317* | (2013.01) |
| *B05B 17/06* | (2006.01) |

(52) U.S. Cl.
CPC .......... *H01G 7/06* (2013.01); *H01L 41/0805* (2013.01); *H01L 41/0973* (2013.01); *H01L 41/1871* (2013.01); *H01L 41/317* (2013.01); *B05B 17/0661* (2013.01)

(58) Field of Classification Search
CPC ............... H01G 4/12; H01G 4/06; H01G 4/14
USPC ................................. 361/277, 278, 311–313
See application file for complete search history.

(56) References Cited

U.S. PATENT DOCUMENTS

| 5,271,797 A | 12/1993 | Kamisawa |
| 5,729,262 A | 3/1998 | Akiyama et al. |
| | (Continued) | |

FOREIGN PATENT DOCUMENTS

| JP | 58-016336 | 7/1977 |
| JP | 01-197303 | 8/1989 |
| | (Continued) | |

OTHER PUBLICATIONS

S. Halder et al. "Structural, dielectric and electromechanical study of Hf-substituted BaTiO3 thin films fabricated by CSD" *Applied Physics A—Materials Science & Processing*, A83, pp. 285-288 (2006).

(Continued)

*Primary Examiner* — Nguyen Ha
(74) *Attorney, Agent, or Firm* — IPUSA, PLLC

(57) ABSTRACT

A complex oxide includes a chemical compound represented by $ABO_3$ (Chemical Formula 1). In the Chemical Formula 1, A is one or more elements selected from Ba, Ca, and Sr; and B is one or more elements selected from Ti, Zr, Hf, and Sn. When a field having a size of 1 μm×1 μm on a surface of the complex oxide is observed with an atomic force microscope (AFM), a typical particle size is greater than or equal to 300 nm and less than 660 nm. Here, the typical particle size is a maximum length of a maximum particle observed in the field.

6 Claims, 11 Drawing Sheets

(56) References Cited

U.S. PATENT DOCUMENTS

| | | | |
|---|---|---|---|
| 8,216,858 B2* | 7/2012 | Takashima | B82Y 30/00 |
| | | | 252/62.9 R |
| 8,425,026 B2 | 4/2013 | Machida et al. | |
| 8,454,133 B2 | 6/2013 | Mizukami et al. | |
| 8,602,530 B2 | 12/2013 | Mizukami et al. | |
| 8,646,180 B2 | 2/2014 | Akiyama et al. | |
| 2007/0049026 A1* | 3/2007 | Miyamoto | C23C 18/1216 |
| | | | 438/687 |
| 2009/0135546 A1* | 5/2009 | Wang | B32B 18/00 |
| | | | 361/321.2 |
| 2010/0302323 A1 | 12/2010 | Yagi et al. | |
| 2011/0177235 A1 | 7/2011 | Fujii et al. | |
| 2011/0205307 A1 | 8/2011 | Ueda et al. | |
| 2011/0216135 A1 | 9/2011 | Yonemura | |
| 2012/0026249 A1 | 2/2012 | Kihira et al. | |
| 2012/0028075 A1 | 2/2012 | Yagi et al. | |
| 2012/0229573 A1 | 9/2012 | Mizukami et al. | |
| 2013/0002767 A1 | 1/2013 | Mizukami et al. | |
| 2013/0070029 A1 | 3/2013 | Mizukami et al. | |
| 2013/0162726 A1 | 6/2013 | Mizukami et al. | |

FOREIGN PATENT DOCUMENTS

| | | |
|---|---|---|
| JP | 10-020488 | 1/1998 |
| JP | 2877588 | 3/1999 |
| JP | 3107074 | 11/2000 |
| JP | 2001-119079 | 4/2001 |
| JP | 2002-124712 | 4/2002 |
| JP | 2010-206149 | 9/2010 |
| JP | 2011-187672 | 9/2011 |
| JP | 2012009800 | 1/2012 |
| JP | 2012-049161 | 3/2012 |
| JP | 2012-199337 | 10/2012 |

OTHER PUBLICATIONS

Kiyotaka Tanaka et al. "Composition Dependence of Microstructure and Dielectric Properties in Alkoxy-Derived Ba(Ti,Zr)O3 Thin Films" *Japanese Journal of Applied Physics*, vol. 45, No. 1A, pp. 155-159 (2006).

* cited by examiner

COMPLEX OXIDE, THIN-FILM CAPACITIVE ELEMENT, LIQUID DROPLET DISCHARGE HEAD, AND METHOD OF PRODUCING COMPLEX OXIDE

BACKGROUND OF THE INVENTION

1. Field of the Invention

The present invention relates to a complex oxide, a thin-film capacitive element, a liquid droplet discharge head, and a method of producing the complex oxide.

2. Description of the Related Art

A composite oxide material having ferroelectricity has been used as a material of various types of electronic components, such as an electromechanical transducer element or a capacitor.

Lead zirconate titanate (PZT) has been known as a typical complex oxide material having ferroelectricity. However, recently, there is a demand for eliminating specific hazardous materials in manufacture of various types of electronic and electrical equipment (e.g., Restriction of Hazardous Substances (RoHS) Directive). Research have been made for finding an alternative material having ferroelectricity that can substitute for a material including lead as a main component, such as PZT.

For example, Patent Document 1 (Japanese Unexamined Patent Publication No. 2011-187672) discloses bismuth sodium potassium titanate having a perovskite structure, as an example of such a material.

SUMMARY OF THE INVENTION

Dielectric characteristics (e.g., permittivity) of bismuth sodium potassium titanate having a perovskite structure may not be sufficient. Research have been made for finding another complex oxide material having superior dielectric characteristics.

There is a need for a complex oxide material having superior dielectric characteristics.

According to an aspect of the present invention, there is provided a complex oxide including a chemical compound represented by $ABO_3$ (Chemical Formula 1), wherein in the Chemical Formula 1, A is one or more elements selected from Ba, Ca, and Sr; and B is one or more elements selected from Ti, Zr, Hf, and Sn, wherein, when a field having a size of 1 µm×1 µm on a surface of the complex oxide is observed with an atomic force microscope (AFM), a typical particle size is greater than or equal to 300 nm and less than 660 nm, wherein the typical particle size is a maximum length of a maximum particle observed in the field.

According to another aspect of the present invention, there is provided a thin-film capacitive element including a first electrode film; a complex oxide thin-film formed on the first electrode film; and a second electrode film formed on the complex oxide thin-film, wherein the complex oxide thin-film is formed of a complex oxide, wherein the complex oxide includes a chemical compound represented by $ABO_3$ (Chemical Formula 1), wherein in the Chemical Formula 1, A is one or more elements selected from Ba, Ca, and Sr; and B is one or more elements selected from Ti, Zr, Hf, and Sn, and wherein, when a field having a size of 1 µm×1 µm on a surface of the complex oxide is observed with an atomic force microscope (AFM), a typical particle size is greater than or equal to 300 nm and less than 660 nm, wherein the typical particle size is a maximum length of a maximum particle observed in the field.

According to another aspect of the present invention, there is provided a liquid droplet discharge head including an electromechanical transducer element, wherein the electromechanical transducer element includes a first electrode film; a complex oxide thin-film formed on the first electrode film; and a second electrode film formed on the complex oxide thin-film, wherein the complex oxide thin-film is formed of a complex oxide, wherein the complex oxide includes a chemical compound represented by $ABO_3$ (Chemical Formula 1), wherein in the Chemical Formula 1, A is one or more elements selected from Ba, Ca, and Sr; and B is one or more elements selected from Ti, Zr, Hf, and Sn, and wherein, when a field having a size of 1 µm×1 µm on a surface of the complex oxide is observed with an atomic force microscope (AFM), a typical particle size is greater than or equal to 300 nm and less than 660 nm, wherein the typical particle size is a maximum length of a maximum particle observed in the field.

According to another aspect of the present invention, there is provided a method of producing a complex oxide by a chemical solution deposition method (a CSD method), wherein the complex oxide includes a chemical compound represented by $ABO_3$ (Chemical Formula 1), wherein in the Chemical Formula 1, A is one or more elements selected from Ba, Ca, and Sr; and B is one or more elements selected from Ti, Zr, Hf, and Sn, and wherein, when a field having a size of 1 µm×1 µm on a surface of the complex oxide is observed with an atomic force microscope (AFM), a typical particle size is greater than or equal to 300 nm and less than 660 nm, wherein the typical particle size is a maximum length of a maximum particle observed in the field.

According to an embodiment of the present invention, a complex oxide having superior dielectric characteristics can be provided.

Other objects, features and advantages of the present invention will become more apparent from the following detailed description when read in conjunction with the accompanying drawings.

DETAILED DESCRIPTION OF THE PREFERRED EMBODIMENTS

Hereinafter, an embodiment of the present invention is explained by referring to the accompanying drawings. However, the present invention is not limited to the embodiment.

First, an example of a complex oxide according to the embodiment is explained.

The complex oxide according to the embodiment includes a chemical compound, which may be represented by following Chemical Formula 1.

$$ABO_3 \qquad \text{(Chemical Formula 1)}$$

In Chemical Formula 1, "A" represents one or more elements selected from Ba, Ca, and Sr; and "B" represents one or more elements selected from Ti, Zr, Hf, and Sn.

When a field having a size of 1 μm×1 μm on a surface of the complex oxide is observed with an atomic force microscope (AFM), a typical particle size is greater than or equal to 300 nm and less than 660 nm. Here, the typical particle size is a maximum length of a maximum particle observed in the field.

The inventors of the present invention have conducted research to find a complex oxide having superior dielectric characteristics (e.g. permittivity). As a result, the inventors have found that dielectric characteristics of a complex oxide may be enhanced by adjusting a typical particle size to be within a predetermined range.

Figure 1:
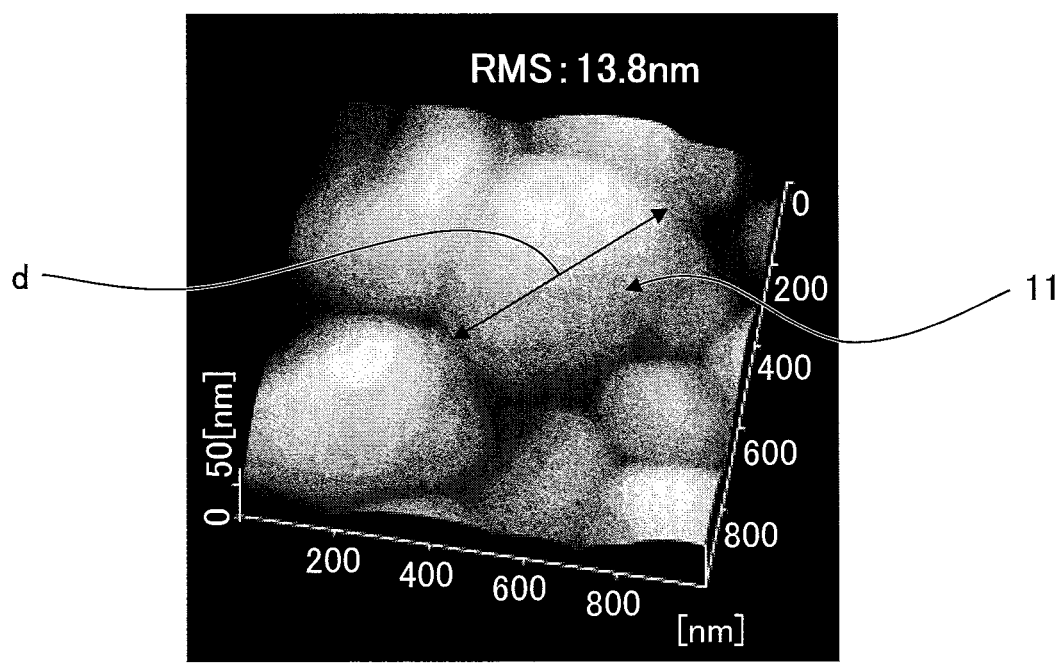
FIG. 1 is a diagram illustrating a typical particle size according to an embodiment.

Here, "typical particle size" is explained by referring to FIG. 1. FIG. 1 shows a result of observing a field having a size of 1 μm×1 μm on a surface of the complex oxide by using the AFM. For the case of FIG. 1, the typical particle size is a maximum length of a particle 11, which has the largest particle diameter in the measurement range of FIG. 1. Specifically, in FIG. 1, the typical particle size corresponds to the particle size "d."

The complex oxide according to the embodiment includes the chemical compound that is represented by above-described Chemical Formula 1, namely, $ABO_3$. A content ratio of the chemical compound represented by $ABO_3$ in the complex oxide is not particularly limited. However, because such a chemical compound exhibits ferroelectricity, the content ratio of the chemical compound in the complex oxide can be large, namely, the chemical compound can be a main component of the complex oxide. For example, the content ratio of the chemical compound represented by $ABO_3$ in the complex oxide may be greater than or equal to 80 mol %. The content ratio of the chemical compound represented by $ABO_3$ in the complex oxide may be greater than or equal to 90 mol %. Since a complex oxide not including lead is needed, the complex oxide according to the embodiment may preferably be a material other than a material including lead.

As described above, the chemical compound that is represented by $ABO_3$ is such that "A" is one or more elements selected from Ba, Ca, and Sr; and "B" is one or more elements selected from Ti, Zr, Hf, and Sn. In this case, "A" includes a bivalent cation, and "B" includes a four-valent cation.

As the chemical compound represented by $ABO_3$, it suffices if one or more elements selected from Ba, Ca, and Sr are included in a site represented by "A," and one or more elements selected from Ti, Zr, Hf, and Sn are included in a site represented by "B." Composition of the chemical compound represented by $ABO_3$ is not particularly limited.

The site represented by "A" of the chemical compound $ABO_3$ may preferably include at least Ba. When the site represented by "A" includes Ba, dielectric characteristics (e.g., permittivity) of the chemical compound $ABO_3$ can be particularly enhanced. A content ratio of Ba in the site represented by "A" is not particularly limited. However, when the content ratio of Ba in the site represented by "A" is large, the dielectric characteristics of the chemical compound $ABO_3$ can be enhanced. Accordingly, the content ratio of Ba in the site represented by "A" may preferably be greater than or equal to 80%. The content ratio of Ba in the site represented by "A" may more preferably be greater than or equal to 90%. The upper limit of the content ratio is not particularly limited. For example, the site represented by "A" may include only Ba.

Additionally or alternatively, the complex oxide according to the embodiment may include a chemical compound represented by Chemical Formula 2 below.

$$BaB_2O_4 \qquad \text{(Chemical Formula 2)}$$

A content ratio of the chemical compound represented by Chemical Formula 2 in the complex oxide according to the embodiment is not particularly limited. The content ratio of the chemical compound represented by Chemical Formula 2 in the complex oxide may be suitably adjusted. However, the chemical compound represented by Chemical Formula 2 may preferably be included in the complex oxide according to the embodiment, so that a percentage of the content of the chemical compound represented by Chemical Formula 2 with respect to the content of the chemical compound represented by Chemical Formula 1 (i.e., $ABO_3$), which is included in the complex oxide according to the embodiment, is greater than or equal to 0.5 mol % and less than or equal to 3 mol %.

The chemical compound represented by Chemical Formula 2 (i.e., $BaB_2O_4$) has a function to promote crystal growth of the complex oxide according to the embodiment. By adding the chemical compound represented by Chemical Formula 2 (i.e., $BaB_2O_4$), the typical particle size of the complex oxide according to the embodiment can be easily adjusted to be within a predetermined range. In order to sufficiently promote such crystal growth of the complex oxide according to the embodiment, the chemical compound represented by Chemical Formula 2 may be included in the complex oxide according to the embodiment, so that the content of the chemical compound represented by Chemical Formula 2 with respect to the content of the chemical compound represented by Chemical Formula 1 (i.e., $ABO_3$), which is included in the complex oxide according to the embodiment, is greater than or equal to 0.1 mol %. The chemical compound represented by Chemical Formula 2 may be included in the complex oxide according to the embodiment, so that the content of the chemical compound represented by Chemical Formula 2 with respect to the content of the chemical compound represented by Chemical Formula 1 (i.e., $ABO_3$), which is included in the complex oxide according to the embodiment, is greater than or equal to 0.5 mol %.

Here, even if the chemical compound represented by Chemical Formula 2 is excessively added to the complex oxide according to the embodiment, the chemical compound represented by Chemical Formula 2 may not significantly promote the crystal growth. On the contrary, since the chemical compound represented by Chemical Formula 2, namely by $BaB_2O_4$, does not exhibit ferroelectricity by itself, when the chemical compound represented by Chemical Formula 2 is excessively added, the permittivity of the complex oxide may be lowered. Accordingly, the chemical compound represented by Chemical Formula 2, namely by $BaB_2O_4$, may be included in the complex oxide according to the embodiment, so that the content of the chemical compound represented by Chemical Formula 2 with respect to the content of the chemical compound represented by Chemical Formula 1 (i.e., $ABO_3$) is less than or equal to 5 mol %, or may be less than or equal to 3 mol %.

Hereinafter, there is explained a method of producing the complex oxide according to the embodiment.

The method of producing the complex oxide according to the embodiment is not particularly limited, provided that the complex oxide having the predetermined typical particle size can be produced by the method. For example, the complex oxide according to the embodiment may be produced by a chemical solution deposition (CSD) method.

A specific procedure is explained below.

As a starting material (which may be a precursor solution (or a SCD solution)), a solution including a metal organic compound may be used. Here, the metal organic compound includes elements, which are included in the complex oxide. As such a metal organic compound, for example, an alkoxide compound, an acetate, or an acetylacetonate salt may be used, which includes elements included in the complex oxide. When the solution, which is the mixture of the metal organic material including the elements (which are the elements included in the complex oxide), is used as the starting material, a compound having a desired stoichiometric ratio may be obtained from that solution (which is the precursor solution).

Specifically, for example, when a complex oxide including $BaTiO_3$, as the chemical compound represented by $ABO_3$, is to be produced, a solution can be used as a starting material, in which barium ethoxide and titanium isopropoxide are mixed with a predetermined ratio. Further, when different elements are to be added to site "A" and site "B," respectively, the solution can be used as the starting material such that the solution includes alkoxide compounds, acetates, or acetylacetonate salts, which correspond to the elements to be added.

For mixing the metal organic compounds of the corresponding elements included in the complex oxide, a common solvent may be used for the precursor solution. The common solvent is not particularly limited. For example, an alcohol can be used as the common solvent, such as normal propanol, normal butanol, or methoxyethanol. In particular, methoxyethanol may preferably be utilized. For example, as described above, when a barium alkoxide, which is a low-soluble material, is utilized as a metal organic compound including an element that is included in the complex oxide, methanol may be mixed as a second component of the common solvent. Then, a homogeneous solution is prepared based on these materials, in accordance with a usual method of preparing a CSD precursor solution.

Since stability of the prepared CSD solution (a coating liquid) may be insufficient, monoethanolamine, diethanolamine, or triethanolamine may be further added to the precursor solution as a peptizing agent. By adding a peptizing agent, a CSD solution is obtained that can be preserved for a long time period.

To the CSD solution, a so-called sintering agent that promotes growth of crystal grains may be added as an accessory component. In general, a melting point of a sintering agent is lower than a crystallization temperature of polycrystalline complex oxide. The sintering agent forms a liquid phase during crystallization. In a liquid phase which is formed in this manner, material transfer is facilitated, and crystal growth of the polycrystalline complex oxide (so-called the growth of crystal grains) is promoted. The type of sintering agent to be used is not particularly limited, and the type of sintering agent may be suitably selected. For example, $BaB_2O_4$, $SiO_2$, $B_2O_3$, $Li_2O_3$ or $Bi_2O_3$ may be utilized.

As a sintering agent, a chemical compound represented by Chemical Formula 3 below can preferably be utilized.

$BaB_2O_4$  (Chemical Formula 3)

An addition amount of the chemical compound represented by Chemical Formula 3 is not particularly limited. The addition amount may suitably selected. However, the chemical compound represented by Chemical Formula 3 may preferably be included in the complex oxide, so that the content of the chemical compound represented by Chemical Formula 3 with respect to the content of the chemical compound ($ABO_3$) represented by Chemical Formula 1, which is included in the complex oxide, is greater than or equal to 0.5 mol % and less than or equal to 3 mol %.

For adding the chemical compound represented by Chemical Formula 3 to the CSD solution, some chemical compounds may preferably be added to the CSD solution, so that the chemical compound represented by Chemical Formula 3 is produced during a process of drying and baking the CSD solution. The chemical compound represented by Chemical Formula 3 may be added to the CSD solution, by adding a predetermined ratio of a metal organic compound including boron and a metal organic compound including barium. At this time, the metal organic compound including boron and the metal organic compound including barium may preferably be added to the CSD solution, so that the content of the chemical component represented by Chemical Formula 3 with respect to the content of the chemical compound ($ABO_3$) represented by Chemical Formula 1, which is included in the complex oxide, is greater than or equal to 0.5 mol % and less than or equal to 3 mol %.

By adding a sintering agent to the CSD solution, crystal grains can be enlarged. Accordingly, a complex compound having a desired typical particle size can be formed at a lower temperature.

A concentration of the CSD solution, namely, a concentration of a component of the complex oxide included in the CSD solution is not particularly limited. However, when the concentration of the CSD solution is small, a longer time period and greater energy may be required for removing the solvent, and thereby the productivity may be lowered. When the concentration of the CSD solution is large, some components in the solution may be precipitated. Moreover, for forming a coating film, it may be difficult to handle the solution, and a coating film having a uniform thickness may not be formed. Accordingly, the concentration of the CSD solution may be greater than or equal to 0.1 mol/l and less than or equal to 0.8 mol/l, for example. The concentration of the CSD solution may preferably be greater than or equal to 0.2 mol/l and less than or equal to 0.4 mol/l. Here, the concentration of the CSD solution means the concentration of the complex oxide that is calculated from concentration of each of the elements included in the CSD solution.

Next, there is explained a procedure of producing the complex oxide from the CSD solution, which is prepared as described above. In the explanation of the producing process below, a process of forming a film-shaped complex oxide is explained. However, a shape of the complex oxide is not limited to a film shape.

Figure 2:
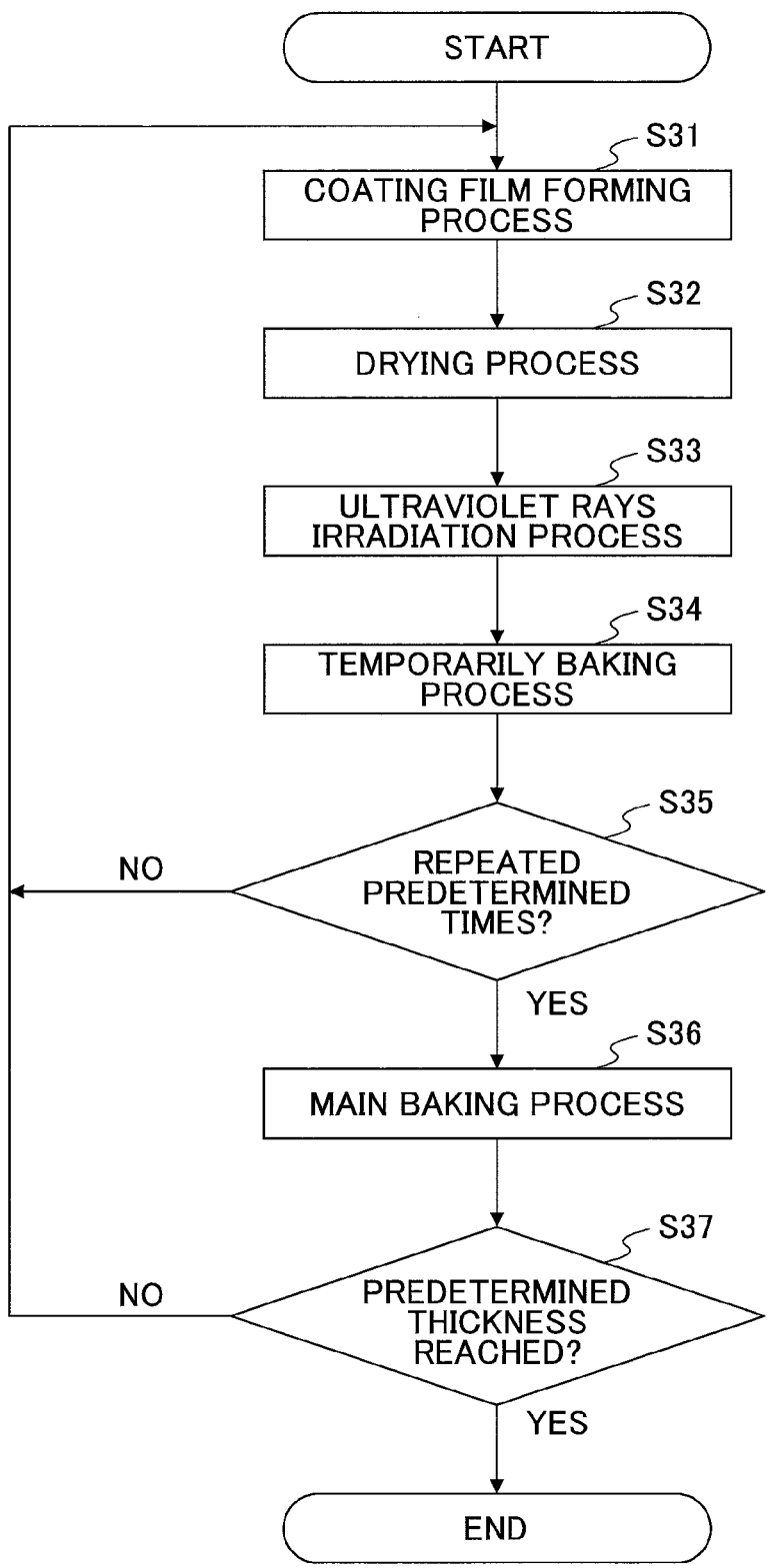
FIG. 2 shows a flowchart of a process of producing a complex oxide according to the embodiment.

The complex oxide according to the embodiment can be produced, for example, by the procedure of the flowchart shown in FIG. 2.

The flowchart shown in FIG. 2 includes the following Process 1 to Process 5.

(Process 1) CSD coating film forming process (S31)
(Process 2) Coating film drying process (S32)
(Process 3) Ultraviolet rays irradiation process (S33)
(Process 4) Temporary baking process (S34)
(Process 5) Main baking process (S36)

At step S35, a determination is made as to whether a number of times of repetition reaches a predetermined number of times, so as to ensure that Process 1 (S31) of the coating film forming process to Process 4 (S34) of the temporary baking process are repeated the predetermined number of times. When a determination is made that Process 1 to Process 4 are repeated the predetermined number of times, Process 5 is performed. After completing Process 5, at step S37, a determination is made as to whether the complex oxide obtained by performing Process 1 to Process 5 has a desired thickness. When a determination is made that the desired thickness is not reached, the process returns to Process 1 again, and subsequently Process 1 to Process 5 are repeatedly performed. When a determination is made that the desired thickness is reached, the producing process is terminated.

Hereinafter, there are explained details of each of the processes.

(Process 1) CSD Coating Film Forming Process

A coating film is formed by applying the CSD solution (which is the precursor solution of the complex oxide) prepared in accordance with the above-described procedure to a portion of a substrate on which the complex oxide is to be formed.

The method of applying the CSD solution is not particularly limited. The method of applying the CSD solution may be selected from various types of coating methods, depending on a desired shape of the film, for example. The CSD solution may be applied onto a substrate by a spin coating method, for example.

The substrate is not particularly limited. For example, when the complex oxide is to be formed between a first electrode and a second electrode as described later, one of the first and second electrodes may be formed on the substrate in advance, and a coating film of the CSD solution may be formed on the one of the first and second electrodes.

The thickness of the coating film formed by applying the CSD solution is not particularly limited. However, when the thickness of the coating film is excessively large, a pore may be formed within the film during the drying process, the temporary baking process, and/or the main baking process described below. Thus, it may be undesirable that the thickness of the coating film is excessively large. Accordingly, the thickness of the coating film at Process 1 may be selected, so that the thickness of the film obtained by applying each of Process 1 to Process 5 once becomes less than or equal to 100 nm after the main baking process. The thickness of the coating film at Process 1 may preferably be selected, so that the thickness of the film obtained by applying each of Process 1 to Process 5 once becomes less than or equal to 90 nm after the main baking process.

When the thickness of the film is too small, Process 1 to Process 5 may be repeated several times to form the complex oxide having the desired thickness. However, it may be undesirable to do so, because the productivity may be lowered. Accordingly, the thickness of the coating film at Process 1 may be selected, so that the thickness of the film obtained by applying each of Process 1 to Process 5 once becomes greater than or equal to 10 nm after the main baking process. The thickness of the coating film at Process 1 may preferably be selected, so that the thickness of the film obtained by applying each of Process 1 to Process 5 once becomes greater than or equal to 50 nm after the main baking process.

(Process 2) Coating Film Drying Process

The drying process is performed so as to remove the solvent from the CSD solution. It suffices if the solvent of the CSD solution is removed by the drying process. Thus, a condition of the drying process is not particularly limited. However, when the drying process is applied at a temperature that is greater than or equal to the boiling point of the main solvent included in the CSD solution, since the solvent rapidly vaporizes, a pore may be formed within the film, or a surface shape of the film may be deteriorated. Accordingly, the drying process may be performed at a temperature which is less than or equal to the boiling point of the main solvent of the CSD solution.

The method and means for the drying process is not particularly limited. For example, a substrate on which the coating film is formed may be placed on a hot plate, which is maintained at the temperature of the drying, and a heating process may be applied. A time period of the processing is not particularly limited. However, the time period of the heating may be less than or equal to fifteen minutes. The time period of the heating may preferably be less than or equal to five minutes.

By Process 2, the solvent (an organic solvent) in the coating film formed by Process 1 is removed.

(Process 3) Ultraviolet Rays Irradiation Process

In Process 3, ultraviolet rays are irradiated onto the dried CSD coating film. The dried CSD coating film includes organic components, which form molecular bonding. Process 3 is for moving these organic components out of the film by a photochemical reaction by irradiation of ultraviolet radiation. When the CSD solution (the precursor solution) does not includes amine, for example, Process 3 may not be performed. However, Process 3 can be preferably performed so as to reduce forming of pores in the film.

Figure 3A:
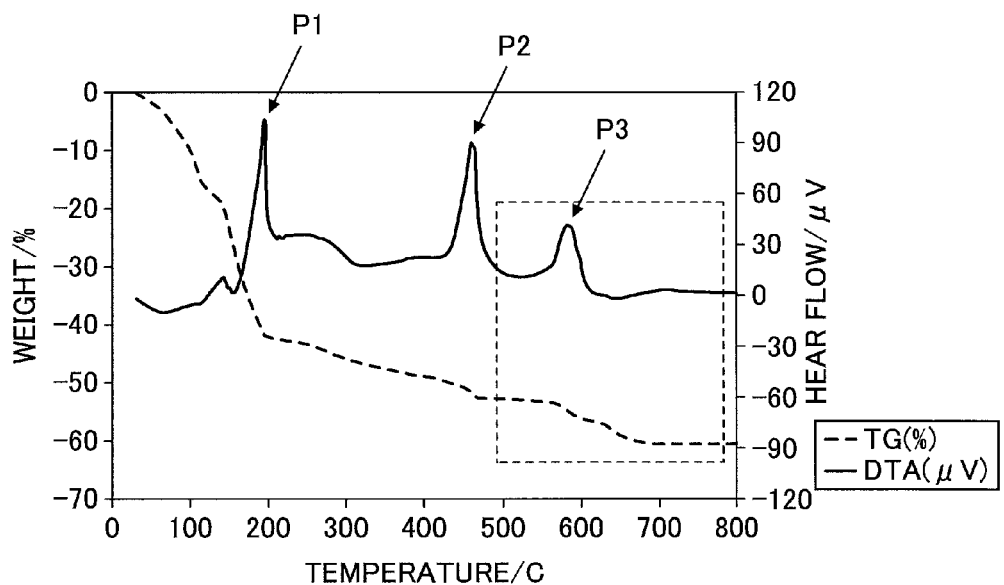
FIGS. 3A and 3B shows TG/DTA curves of a dried CSD coating film according to the embodiment.
Figure 3B:
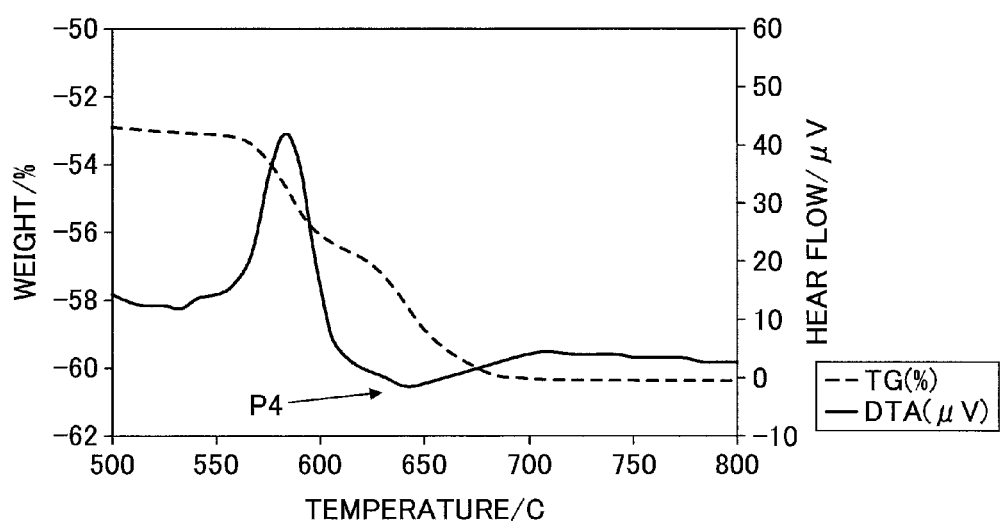

FIGS. 3A and 3B show examples of TG/DTA curves, when a coating film formed by applying the CSD solution is heated. FIG. 3A shows a general view of the TG/DTA curves. FIG. 3B is a diagram magnifying a portion of FIG. 3A, which is surrounded by a middle dotted line. The TG/DTA curves shown in FIGS. 3A and 3B are derived by measuring the CSD solution, which is for forming the complex oxide including barium titanate, and which is prepared for producing Sample No. 1-1 of Experiment 1 described below, after the CSD solution is applied onto the substrate, and the CSD solution is dried while the pressure is reduced.

As shown in FIG. 3A, four peaks appear in the DTA curve due to heat balance.

In FIG. 3A, P1 may be a peak due to first burning of an organic material. In the TG curve, a decrease in weight can also be observed. Such a peak may be attributable to burning of an organic material which is included in the network of gels.

In FIG. 3A, P2 may be a peak due to burning of a second organic material. A decrease in weight can also be found in the TG curve. Such a peak may correspond to burning of an alkoxide group of a metal alkoxide.

In FIG. 3A, P3 may be a peak due to burning of an amine component (an organic material). In the TG curve, a decrease in weight can also be found. Such an amine component is derived from a component of amine, which is included, for example, as a peptizing agent or another accessary component. The amine component may have been coordinated with a metal included in the CSD solution, and may have formed a metal complex.

In FIG. 3B, P4 is an endothermic peak due to self-decomposition of a barium carbonate and generation of barium oxide. In this case, a decrease in weight can also be observed in the TG curve. Such a barium carbonate is generated when barium oxide reacts with carbon dioxide in atmosphere.

As explained for P3, amine forming a metal complex by a strong coordinate bond may be decomposed and separated by high temperature processing of approximately from 550° C. to 600° C.

When such a separation reaction of amine occurs at a high temperature, a carbonate formation reaction is accelerated between a metal or its oxide, which is formed by separating amine, and carbon dioxide in atmosphere. Then, due to largeness of the carbonate, thermal expansion is induced, and after that volume shrinkage occurs due to subsequent separation.

During the volume shrinkage, a gap is formed. Such a gap may significantly lower solid-state reactivity among elements included in the complex oxide, and may be a cause of forming a pore (a hole) in a crystallized film. Since such a pore may degrade a film characteristic, the carbonate forming reaction by intermediate products of the complex oxide may preferably be avoided by suppressing the amine separation reaction at the high temperature.

The ultraviolet rays irradiation process in Process 3 has a significant effect on reducing such pores. The mechanism may be such that the coordinate bond of amine which forms the metal complex is cut by using a photochemical reaction, instead of thermal energy.

For example, when the coordinate bond of amine, by which the metal complex is formed, is to be cut by the thermal energy, as the TG/DTA curves in the measured result, the CSD coating film is heated to be greater than or equal to 550° C. The coordinate bonding is cut at the temperature greater than or equal to 550° C. Since 550° C. is a high temperature, as described above, a carbonate may be formed instantaneously.

In the photochemical reaction, the coordinate bond may be cut at a room temperature. Accordingly, the carbonate forming reaction of the metal and the oxide generated from the metal may progress slowly.

During the cutting of the coordinate bond of amine, by performing the cutting in an atmosphere in which carbon dioxide is eliminated as much as possible from a processing atmosphere, carbon dioxide may be prevented from being formed. When the thermal decomposition processing is performed under an oxide atmosphere, it may be difficult to eliminate the influence of the residual carbon dioxide. However, by using the photochemical reaction, carbon dioxide may be eliminated from the processing atmosphere almost completely. In this manner, a carbonate may be prevented from being generated.

As for the wavelength of ultraviolet radiation to be utilized, ultraviolet radiation in a range in which the wavelength of the ultraviolet radiation is less than or equal to the wavelength corresponding to the bond energy of C—N bonding and the bond energy of N—H bonding included in an amine molecule may preferably be utilized. At room temperature, the bond energy of C—N bonding is 64 kcal/mol, and the bond energy of N—H bonding is 92 kcal/mol. Accordingly, by irradiating light having a wavelength which is less than or equal to 310 nm, C—N bonding and N—H bonding can be photodecomposed.

A low pressure mercury lamp may be utilized as a light source. Since emission wavelength of the low pressure mercury lamp is 254 nm or 185 nm, any type of low pressure mercury lamp may be utilized.

Additionally, the following types of excimer lamps are known. The corresponding wavelengths are as shown below.

| | |
|---|---|
| XeCl (xenon chloride) excimer lamp | 308 nm |
| KrF (krypton fluoride) excimer lamp | 248 nm |
| KrCl (krypton fluoride) excimer lamp | 222 nm |
| ArF (argon fluoride) excimer lamp | 193 nm |
| Xe (xenon) excimer lamp | 172 nm |

Any one of the above-described excimer lamps may be utilized. Since the efficiency of generating the ultraviolet radiation by an excimer lamp is better by one digit relative to that of a mercury lamp, the excimer lamp may be suitable for the photochemical reaction.

Among the above-described excimer lamps, when an excimer lamp which emits ultraviolet radiation having a wavelength which is greater than or equal to 200 nm, the C—N bonding and the N—H bonding may be directly decomposed by the irradiation of the ultraviolet radiation. When an excimer lamp which emits ultraviolet radiation having a wavelength which is less than 200 nm, the C—N bonding and the N—H bonding may not be directly decomposed. Instead, the decomposition may be a decomposition reaction through ozone. Since in either case, bonds of amine can be decomposed, both the above-described excimer lamps may be utilized.

As described above, when the wavelength of the ultraviolet radiation is greater than or equal to 200 nm, ozone may not be generated by the photochemical reaction of oxygen in the atmosphere. Thus, a special usage environment may not be required, and such ultraviolet radiation may preferably utilized. Specifically, the KrCl excimer lamp, the KrF excimer lamp, and the XeCl excimer lamp may preferably utilized.

(Process 4) Temporary Baking Process

This process is a process of temporarily baking a sample material, which is produced by drying the CSD solution.

As described above, the ultraviolet rays irradiation processing is applied between the drying process and Process 4. After the irradiation of the ultraviolet rays, the film is in an amorphous state of the oxide corresponding to the various types of metallic elements, i.e., a portion of the complex oxide film is in an amorphous state. In this process, the film is heated, and the state of the film is converted into a crystal state of the complex oxide to be produced.

Conditions during heating, namely, conditions of the heating process are not particularly limited. The conditions may be selected depending on the complex oxide to be produced.

However, when the film includes an element (which is included in the complex oxide), whose oxide easily reacts with carbon dioxide in the atmosphere and generates a carbonate, the film may preferably be heated in this process until the temperature, which exceeds the decomposition temperature of the carbonate, and at which the elements are converted into the complex oxide and a microcrystal of the complex oxide is grown.

That is because, when the oxide of the element (which is included in the complex oxide) forms a carbonate with an element that can easily react with carbon dioxide in the atmosphere, such as an alkali earth metal element, the element that forms the carbonate is prevented from reacting with another element to form the complex oxide, until the carbonate is decomposed. Another reason for doing this is that, even if the film is heated to a temperature that is greater than or equal to the temperature at which the carbonate is thermally decomposed, and that is less than or equal to the temperature at which the complex oxide is formed, when the temperature of the complex oxide is subsequently lowered to a room temperature, the complex oxide may form a carbonate again, and the heating process may be meaningless.

Accordingly, in this process, the film may preferably heated until the temperature, which exceeds the decomposition temperature of the carbonate, and at which the elements are converted into the complex oxide and a microcrystal of the complex oxide is grown. In this manner, the reaction can be promoted.

Such a temperature can be suitably selected by performing the TG/DTA measurement, such as shown in FIG. 3, in advance for the sample. For example, the heating process may preferably be performed until a temperature, which is greater than the thermal decomposition temperature by at least +50° C. Here, the thermal decomposition temperature can be found by the TG/DTA measurement.

For the example of the sample shown in FIGS. 3A and 3B, the sample may preferably be heated to be greater than or equal to 650° C., which is a temperature obtained by adding +50° C. to the temperature in the vicinity of P4, which is a peak of a decomposition temperature. An upper limit value of the temperature of the temporary baking process is not particularly limited. However, the upper limit value of the temperature of the temporary baking process may preferably be less than or equal to the crystallization temperature described below. For example, for the case of the sample shown in FIG. 3, the upper limit value of the temperature of the temporary baking process may preferably be less than or equal to 800° C.

(Process 6) Main Baking Process

This process is a process in which baking is further performed, after the temporary baking process. This process is for growing the crystal grains of the complex oxide, which is produced by the temporary baking process. The crystal grains are grown to be large crystal grains by thermal energy, so that the large crystal grains may show a strong ferroelectric property.

The main baking process may be performed immediately after the temporary baking process. However, if the main baking process is performed each time one layer is formed, the number of processes is increased, and the productivity may be lowered. Accordingly, the main baking process may be performed after Process 1 to Process 4 are repeated a predetermined number of times.

The number of times of repeating Process 1 to Process 4 until the main baking process is not particularly limited. The number of times of repeating Process 1 to Process 4 may be suitably selected by considering the thickness of the desired complex oxide film. The film after applying the temporary baking process includes a crystal. However, the volume of the complex oxide film may vary by the growth of the crystal in the main baking process. Depending on the thickness of the sample, a crack may occur in the complex oxide by this variation of the volume (the volume may be reduced by shrinking). Accordingly, this baking process may preferably be performed each time the film thickness increases by an amount, which is a suitable film thickness with which no crack may occur.

The heating temperature in the main baking process is not particularly limited. However, this heating process may preferably be performed at a temperature, which is greater than or equal to the temperature of the temporary baking process.

An upper limit of the heating temperature in the main baking process is not particularly limited. However, the temperature may preferably be selected by considering the heat resisting temperature of a member on which the complex oxide is formed. Specifically, for example, the temperature may be selected, so that a substrate and a member attached to the substrate may not be molten, or neighboring members may not be broken due to a difference in coefficients of thermal expansion. For example, when a complex oxide film is to be formed on a silicon substrate, the main baking process may preferably be performed at a temperature, which is less than or equal to 1050° C. Especially, the main baking process may preferably be performed at a temperature, at which crystallization is sufficiently promoted, and at which functions of other elements are not adversely affected. Accordingly, the processing temperature (the heating temperature) of the main baking process (Process 6) may be set to be greater than or equal to 800° C. and less than or equal to 950° C.

When the heating process is applied in the main baking process, as the temperature increases, diffusion velocity on the surfaces of the crystal grains of the complex oxide increases, and large grain structures are formed. The large grain structures enhance the dielectric characteristics of the complex oxide.

As described above, when a component which functions as a sintering agent is added to the material, the component is molten in this baking process and forms a liquid phase. The liquid phase facilitates moving of atoms on the surface of the crystal grains of the complex oxide. Consequently, growth of the crystal grains may be promoted at a relatively low temperature. Thus, such a component which functions as a sintering agent may preferably be added to the material.

The above-described temporary baking process and the main baking process may be performed under an air atmosphere. The temporary baking process and the main baking process may preferably be performed under an oxygen atmosphere. This is for preventing a carbonate from being generated in the heating process.

The heating processing in the temporary baking process and the main baking process may more preferably be performed under a pressurized oxygen atmosphere. This is because, under the pressurized oxygen atmosphere, growth of crystal grains may be promoted, and the dielectric characteristics may be enhanced. A pressure effect may be observed when the pressure is greater than or equal to 0.3 MPa. The rate of growth of crystal grains increases, as the pressure increases, and the rate of growth of crystal grains is saturated at 1 MPa. Accordingly, the heating process of the temporary baking process and the main baking process may preferably be performed under the pressurized oxygen atmosphere, in which the pressure is greater than or equal to 0.3 MPa and less than or equal to 1 MPa. When the main baking process is performed several times so as to obtain the complex oxide having the desired thickness, it may not be necessary that all the processes are performed under a pressurized atmosphere. For example, the dielectric characteristics may be enhanced, when only the last main baking process is performed under such a pressurized atmosphere.

The method of heating during the temporary baking process and the main baking process is not particularly limited. For example, heating may be performed by using a usual electric furnace or a tubular furnace. Heating may be performed as rapid thermal processing by lamp radiation. An atmosphere may preferably be controlled in these heating method.

Since temperature can be rapidly increased or decreased, the rapid thermal processing by lamp radiation may be effective for reducing processing time. Furthermore, since temperature can be rapidly increased in the rapid thermal processing by lamp radiation, a complex oxide formation reaction can be quickly started, and thereby a carbonate formation reaction can be suppressed. Accordingly, reaction time of the carbonate formation reaction can be reduced in the temporary baking process, and inhibiting factors of subsequent crystallization can be reduced. Specifically, the rapid thermal processing may preferably be performed under an oxygen atmosphere at a processing rate, in which a temperature rising rate is greater than or equal to 10° C. per second. In such a case, formation of a carbonate may be reduced. From a perspective of further reducing formation of a carbonate, the temperature rising rate may preferably be set to be greater than or equal to 30° C. per second.

Hereinabove, the complex oxide and the method of producing the complex oxide according to the embodiment are explained. Since the complex oxide according to the embodiment may exhibit a strong ferroelectric property, the complex oxide can be used for various purposes, for which such a property is required. Hereinafter, a specific application example is explained.

Figure 4:
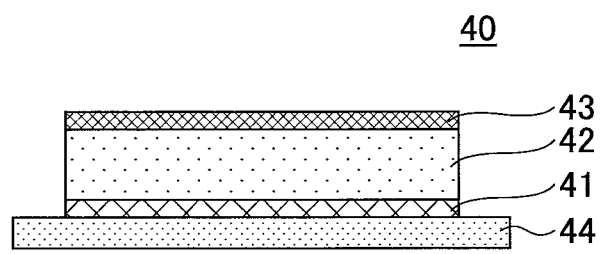
FIG. 4 is a diagram illustrating a structure of a thin-film capacitive element according to the embodiment.

The complex oxide according to the embodiment may be used as a thin-film capacitive element, for example. As shown in FIG. 4, the thin-film capacitive element 40 may include, for example, a first electrode film 41; a complex oxide thin-film 42, which is formed on the first electrode film 41; and a second electrode film 43, which is formed on the complex oxide thin-film 42. Here, the complex oxide thin-film 42 may be formed of the complex oxide according to the embodiment.

As shown in FIG. 4, if it is necessary to support the first electrode film 41, a substrate 44 may be provided. When the substrate 44 is provided, depending on necessity, an insulation film formed of a single layer or a plurality of layers may be formed between the substrate 44 and the first electrode film 44 so as to prevent conduction between the substrate 44 and the first electrode film 41; and/or an adhesion layer may be provided between the substrate 44 and the first electrode film 41 so as to enhance adhesion between the substrate 44 and the first electrode film 41. If it is necessary to protect the thin-film capacitive element 40, an interlayer insulation film may be formed so as to cover an upper surface of the second electrode film 43, and side surfaces of the second electrode film 43, the complex oxide thin-film 42, and the first electrode film 41 (which are shown in FIG. 4). Additionally, lead-out wires may be provided, which are connected to the corresponding electrodes.

As described above, the thin-film capacitive element may be a structure such that the complex oxide according to the embodiment is disposed between two electrodes. For example, the thin-film capacitive element may be an electromechanical transducer element. The electromechanical transducer element may also be referred to as a piezoelectric element. In the electromechanical transducer element, a ferroelectric property of the complex oxide according to the embodiment is utilized.

The thin-film capacitive element, which is an electromechanical transducer element, can be used for a liquid droplet discharge head, for example. Hereinafter, there is explained an example of a configuration of a liquid droplet discharge head including such a thin-film capacitive element by referring to FIGS. 5 and 6.

Figure 5:
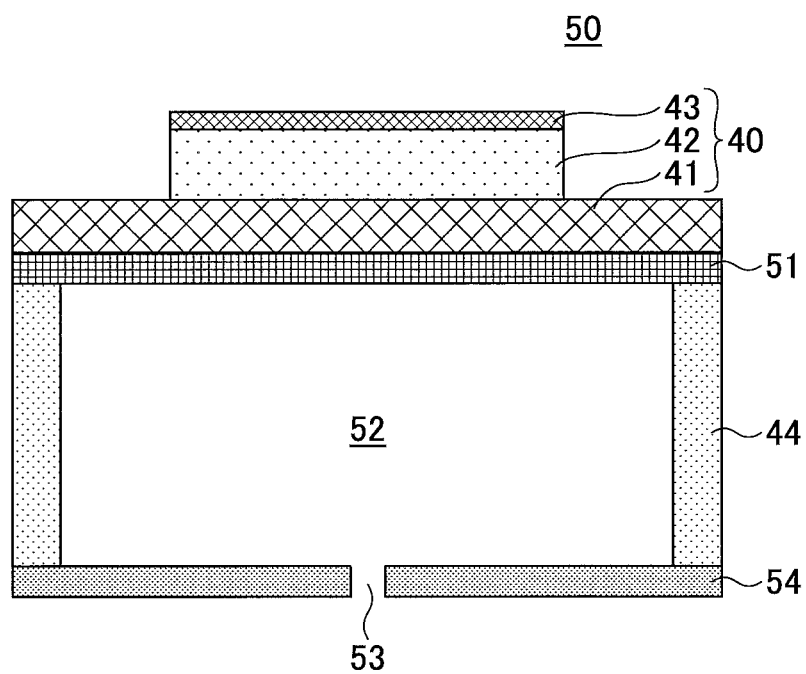
FIG. 5 is a diagram illustrating a configuration of a liquid droplet discharge head according to the embodiment.
Figure 6:
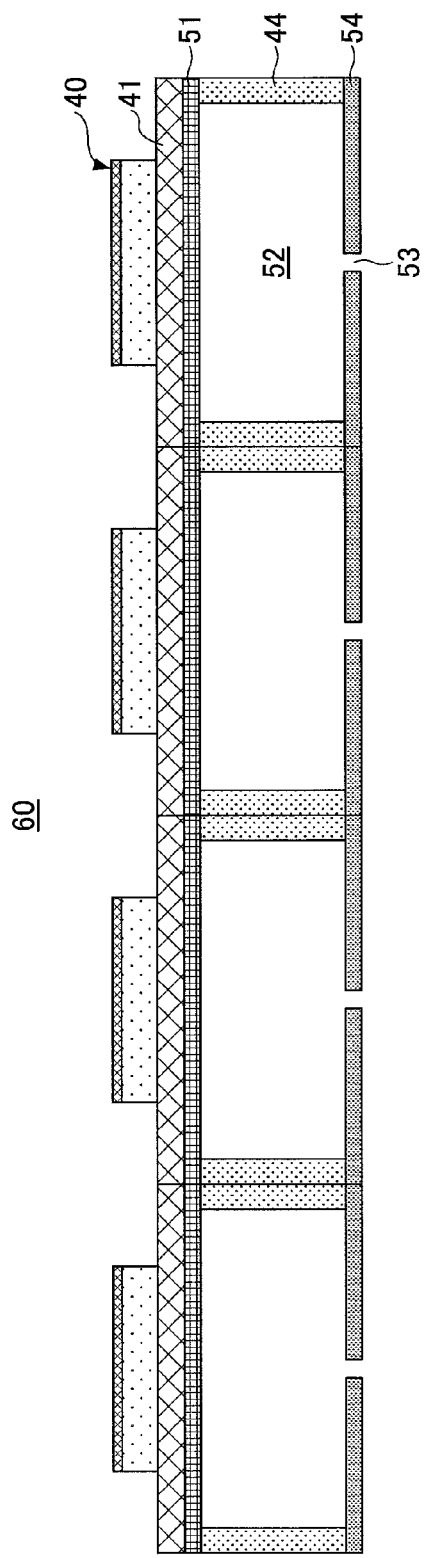
FIG. 6 is a diagram illustrating the configuration of the liquid droplet discharge head according to the embodiment.

FIG. 5 is a cross-sectional view of an example of a liquid droplet discharge head 50 including a single nozzle. FIG. 6 is a cross-sectional view of a liquid droplet discharge head 60. The liquid droplet discharge head 60 is formed by arranging a plurality of the liquid droplet discharge heads 50, each of which includes the corresponding single nozzle.

The configuration of the liquid droplet discharge head 50 is concretely explained by referring to FIG. 5.

The liquid droplet discharge head 50 includes an oscillation plate 51, which is a part of a pressurizing chamber 52. The oscillation plate 51 forms a discharge drive unit. The discharge drive unit causes pressure of a liquid inside a pressurizing chamber 52 to be increased. The thin-film capacitive element 40, which is an electromechanical transducer element, is disposed on the oscillation plate 51. The liquid droplet discharge head 50 includes the pressurizing chamber (pressure chamber) 52. The pressurizing chamber 52 is an ink chamber for accommodating a liquid such as ink (which is referred to as the "ink," hereinafter). The pressurizing chamber 44 is formed by etching the substrate 44, on which the thin-film capacitive element 40 is formed. The liquid droplet discharge head 50 includes a nozzle plate 54 as an ink nozzle. The nozzle plate 54 includes a nozzle 53. The nozzle 53 is a nozzle port, which functions as an ink discharge port for discharging the ink inside the pressurizing chamber 52 in a droplet-like manner.

As a mechanism of the liquid droplet discharge head 50, when electricity is supplied to the first electrode film 41 and the second electrode film 42, stress is generated in the complex oxide thin-film 42, and thereby the oscillation plate 51 oscillates. As the oscillation plate 51 oscillates, the ink inside the pressurizing chamber 52 is discharged from the nozzle 53 in a droplet-like manner. Here, depiction and explanation are omitted for a liquid supply unit that is an ink supply unit for supplying the ink inside the pressurizing chamber 52, an ink flow channel, and fluid resistance.

Materials of the liquid droplet discharge head 50 are not particularly limited. A desired material may be selected, so that the above-described function is achieved. For example, for the substrate 44, a silicon substrate may preferably be used, since the silicon substrate can be easily processed. For the first electrode film 41 and the second electrode film 43, a film formed by laminating Pt films may be used, so that sufficient electric current can be flown. In order to enhance adhesion between the first electrode film 41 and the oscillation plate 51, an adhesion layer (not shown) may preferably be disposed between the first electrode film 41 and the oscillation plate 51. As the adhesion layer, a laminated film may be utilized, which is formed by laminating any one type or two types of films amongst a $AL_2O_3$ film, a $ZrO_2$ film, a $Ta_2O_5$ film, and a $TiO_2$ film. In this case, in order that the layer sufficiently functions as an adhesion layer, a film thickness of the adhesion layer may preferably be greater than or equal to 3 nm. However, when the film thickness is too large, the pressure from the thin-film capacitive element 40 may not be easily conveyed to the liquid inside the pressurizing chamber 52. The film thickness of the adhesion layer may preferably be less than or equal to 100 nm.

As shown in FIG. 6, a liquid discharge head 60 may be utilized, in which a plurality of the liquid droplet discharge heads 50 are arranged.

In the above-described liquid droplet discharge heads 50 and 60, a piezoelectric film is utilized, which is formed of the complex oxide according to the embodiment. The complex oxide included in the liquid droplet discharge heads 50 and 60 does not include lead as a main component. However, the liquid droplet discharge heads 50 and 60 may have sufficient ink discharging performance.

The thin-film capacitive element 40 may be used as a variable capacitive element. The variable capacitive element may also be referred to as a tunable capacitor. For example, capacitance of the thin-film capacitive element 40 can be varied by applying external bias voltage to a portion of the complex oxide thin-film 42 in the thin-film capacitive element 40.

Because of its ferroelectric property, the complex oxide according to the embodiment may have a highly tunable characteristic, as described in an example of experiment below. Accordingly, when the complex oxide according to the embodiment is utilized as a variable capacitive element, a variable range of the capacitance may be large.

Hereinafter, the complex oxide is explained by specific examples of experiment. However, the present invention is not limited to these examples.

Experiment 1

Samples No. 1-1 to No. 1-5 were made by the following procedure, and the samples No. 1-1 to No. 1-5 were evaluated.

The samples No. 1-1 and No. 1-4 were the complex oxide according to the embodiment. The samples No. 1-2, No. 1-3, and No. 1-5 were comparative examples.

(Evaluation Method)

(1) Evaluation of the Typical Particle Size

A typical particle size of the obtained complex oxide film was measured by an atomic force microscope (AFM) (produced by Seiko Instruments, Inc., Model: SPA400) and evaluated.

Figure 7:
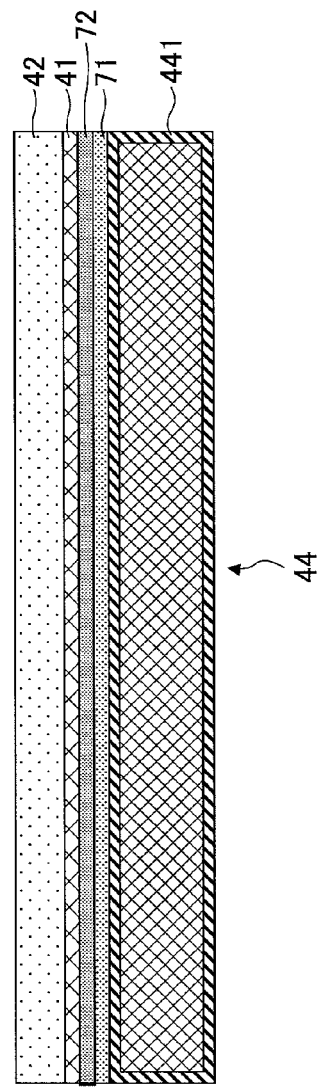
FIG. 7 is a diagram illustrating a sample material, which was produced in Experiment 1.

As a method of evaluation, for each of the samples having the structure shown in FIG. 7, a field having a size of 1 μm×1 μm was observed, which was in a portion of an upper surface of the complex oxide film 42 disposed on the upper most surface in FIG. 7. The typical particle size was determined to be the maximum length of the sample having the maximum size among the particles included in the field.

A sample was evaluated to be good (i.e., ○), when it was determined that crystal grains sufficiently grew based on the typical particle size, and when no crack was formed in the film. Other samples were evaluated to be not good (i.e., x).

(2) SEM Image Observation

A surface of the sample No. 1-5 of Experiment 1 was observed by using a scanning electron microscope (SEM) (produced by Hitachi, Ltd., Model No. S-5500).

(Methods of Producing the Samples)

Hereinafter, methods of producing the samples are explained.

(1) Sample No. 1-1

(a) Preparation of a Substrate

As shown in FIG. 7, as a dielectric film, a thermal oxide film 441 having a thickness of 2 microns was formed on a surface of a 6 inch silicon wafer (the substrate 44).

In order to enhance adhesion between the substrate 44 and the first electrode film 41, an $Al_2O_3$ film, as an adhesion layer 71, was formed on the surface of the substrate 44 by an atomic layer deposition (ALD) method. The adhesion layer 71 was formed so that the thickness of the adhesion layer 71 was 50 nm.

In order to promote crystallization of Pt, a TiOx film (a titanium oxide film) 72 was laminated, so that the thickness of the TiOx film was 5 nm.

Then, a Pt film, as the first electrode film 41, was formed on the TiOx film (the titanium oxide film) 72 by a DC magnetron sputtering method at a substrate temperature of 550° C. The first electrode film 41 was laminated, so that the film thickness of the first electrode film 41 was 100 nm.

(b) Process of Preparing the CSD Solution

In this example, a complex oxide including barium titanate was formed by the CSD method.

Figure 8:
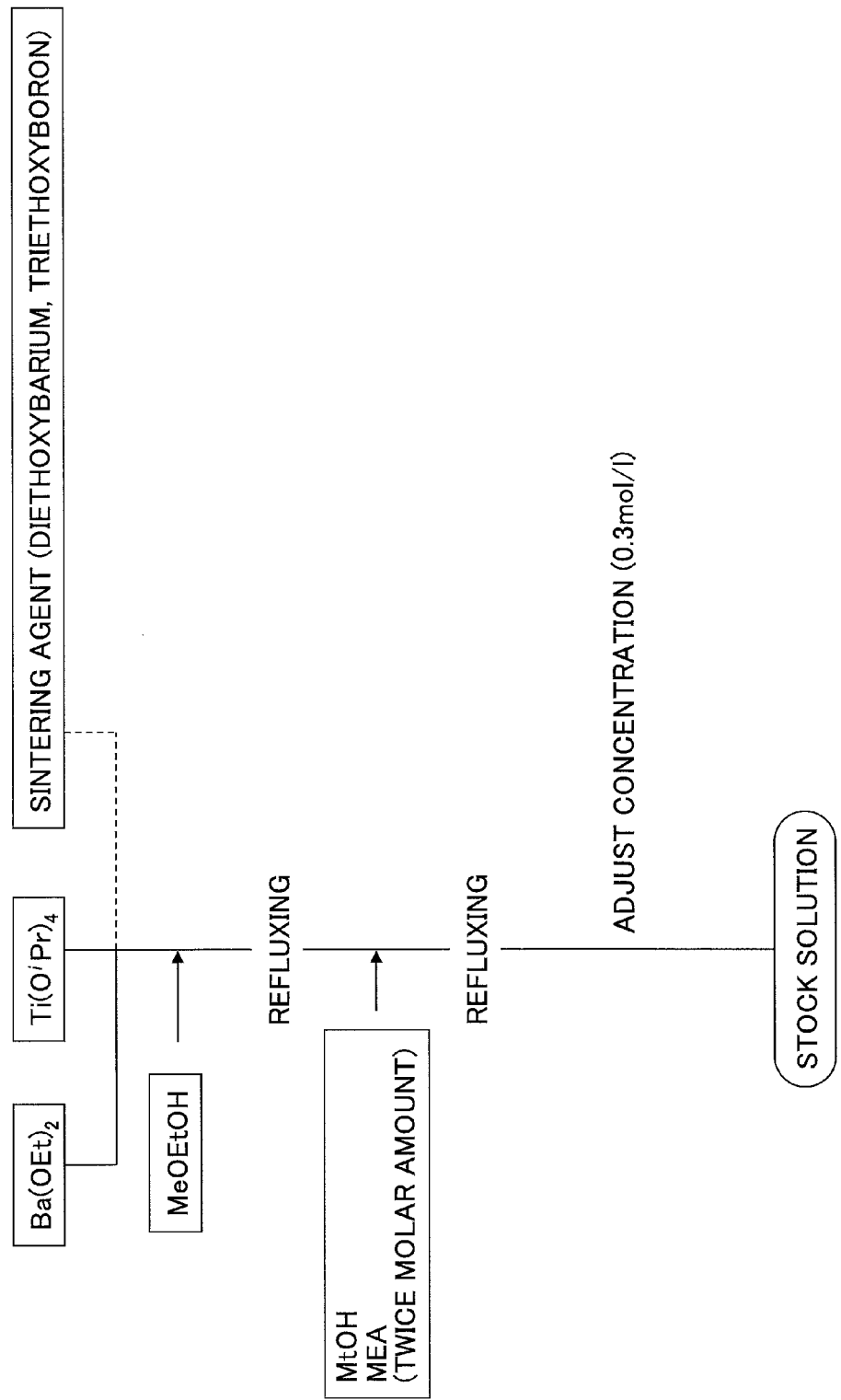
FIG. 8 shows a flowchart of a procedure of preparing a CSD solution in Experiment 1.

The CSD solution was prepared by the following procedure. FIG. 8 shows a corresponding flowchart.

As a starting material, diethoxybarium (produced by Kojundo Chemical Lab. Co., Ltd.) and tetraisopropoxide titanium (produced by Kojundo Chemical Lab. Co., Ltd) were utilized. As a common solvent, methoxyethanol was utilized.

The starting material was dissolved by the common solvent under a nitrogen atmosphere. An alcohol exchange reaction was performed, while setting the reaction temperature to be 125° C. As exchange reaction products, ethanol and isopropyl alcohol were formed by fractional distillation. Subsequently, refluxing was performed for 12 hours.

Next, in order to enhance stability of an alkoxide compound, twice molar amount of monoethanolamine relative to the amount of barium titanate was added to the solution. As a second organic solvent, one-third molar amount of methanol relative to the amount of methoxyethanol was added to the solution. By performing refluxing of the solution at a reaction container temperature of 80° C. for 2 hours, a precursor solution was prepared, in which barium titanate concentration was 0.3 mol/l.

For wettability control with respect to the electrodes and drying speed control, 1% formamide by volume was added to the obtained CSD solution.

(c) CSD Coating Film Forming Process

A CSD coating film was formed by applying the CSD solution to the substrate 44 on which the first electrode film 41 was formed. For forming the CSD coating film, the CSD solution (the precursor solution) was applied onto the substrate 44 (on which the first electrode film (Pt electrode) 41 was formed) by the spin coating method. During application of the CSD solution, the substrate 44 was spun at 4000 rpm for 20 seconds.

(d) Drying Process

The substrate 44, on which the coating film was formed, was disposed on a hot plate of 120° C. for one minute under an air atmosphere, and thereby the organic solvent included in the coating film was dried.

(e) Ultraviolet Rays Irradiation Process

Ultraviolet rays were irradiated onto the dried precursor film by using a Xe excimer lamp (wavelength=172 nm) as a light source. The process was performed while setting the lamp power to 10 mW/cm$^2$, the distance between the light source of the lamp and the substrate 44 to 100 mm, and irradiation time to 5 minutes.

Figure 9:
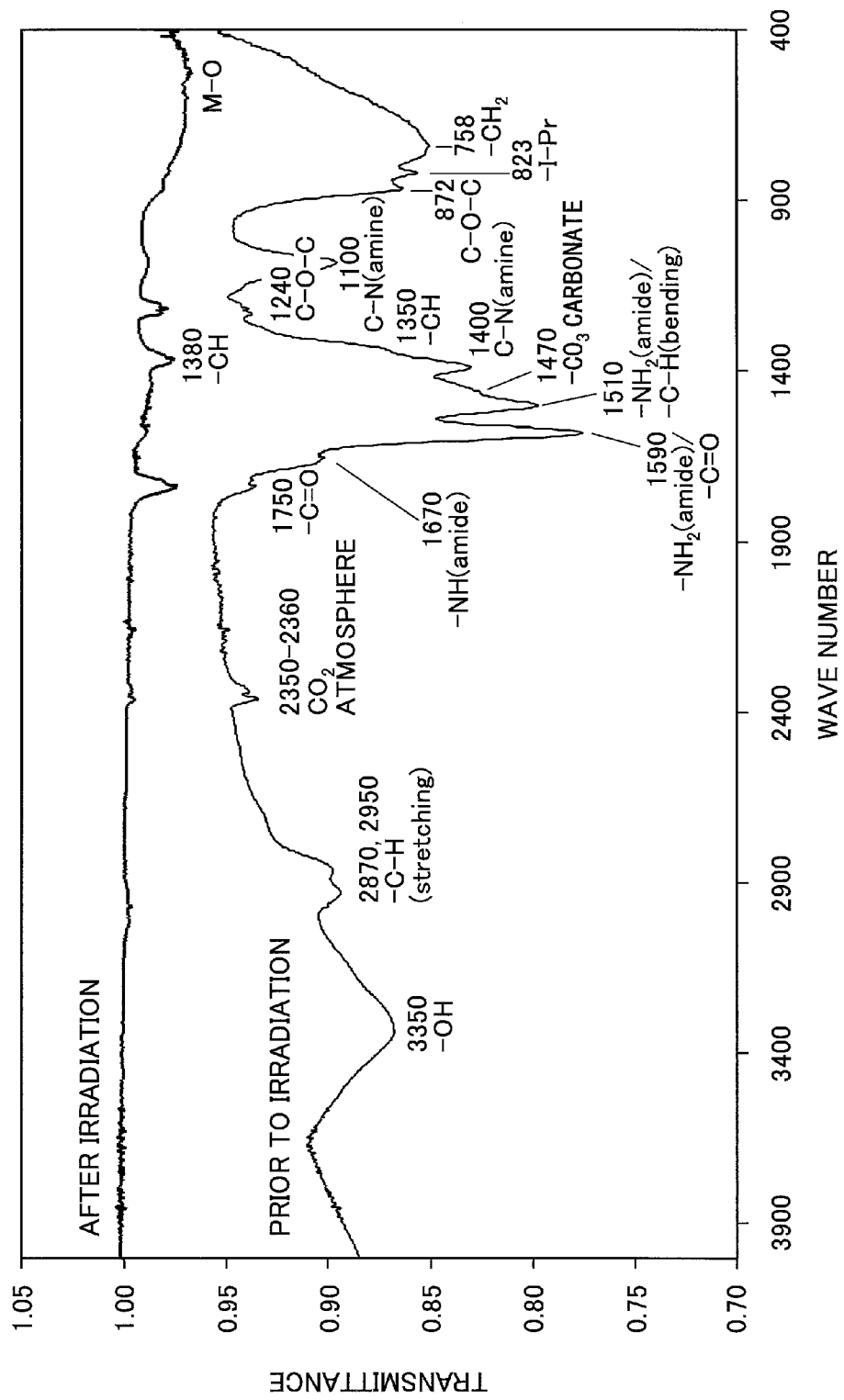
FIG. 9 is a diagram illustrating variation in a FT-IR spectrum between prior to and subsequent to ultraviolet irradiation onto Sample No. 1-1 in Experiment 1.

In order to observe a change in the precursor solution, Fourier transform infrared spectroscopy (FT-IR) measurement was performed for the precursor solution prior to and subsequent to the irradiation of the ultraviolet rays by using a Fourier transform infrared spectrophotometer (produced by Thermo Fisher Scientific K.K., Model No. Nicolet6700). FIG. 9 shows the result of the measurement.

Prior to the irradiation of the ultraviolet rays, in the Fourier transform infrared spectroscopy (FT-IR) spectrum shown in FIG. 9, peaks are observed which are attributable to a C—O bond, a CH$_3$ bond, a carbonate, and a N—H bond, respectively.

Subsequent to the irradiation of the ultraviolet rays, almost all the peaks attributable to an organic functional group disappear. It can be confirmed that a coordinate bond of amine was removed. In the FT-IR spectrum of the sample to which the ultraviolet rays were irradiated, it can be confirmed that a peak has occurred which is attributable to a bond between a metal and oxygen (M-O).

(f) Temporary Baking Process

After the irradiation of the ultraviolet rays, the sample was placed inside an electric furnace, which was heated and maintained at 500° C. The temperature of the sample was increased to 800° C. at a temperature rising rate of 30° C. per minute, and the sample was maintained at 800° C. for five minutes. Subsequently, the temperature of the sample was decreased to 600° C. at a temperature falling rate of 30° C. per minute. After that, the sample was taken out from the electric furnace. The temporary baking process was performed, while setting the atmosphere inside the electric furnace to an oxygen atmosphere.

(g) First Repeating Process

In order to form the complex oxide film having a predetermined film thickness, the processes from the CSD coating film forming process to the temporary baking process were repeated ten times.

(h) Main Baking Process

After completing the tenth temporary baking process by the first repeating process, the temperature of the sample was increased to 1000° C. at a temperature rising rate of 30° C. per minute, and the sample was maintained at 1000° C. for five minutes. Subsequently, the temperature of the sample was decreased to 600° C. at a temperature falling rate of 30° C. per minute. After that, the sample was taken out from the electric furnace. The main baking process was performed, while setting the atmosphere inside the electric furnace to an oxygen atmosphere.

By this ten times of operations, a complex oxide was obtained, which has a film thickness of 0.6 μm.

(i) Second Repeating Process

In order to form a complex oxide thin-film having a predetermined thickness, after completing the first main baking process, the CSD coating film forming process of (b) to the main baking process of (f) were repeated once again. Namely, the processes until the temporary baking process were repeated 20 times in total.

By the above operations, a complex oxide thin-film having a film thickness of 1.2 microns was obtained.

The sample obtained by these processes was evaluated by the above-described methods. The table 1 shows the result of the evaluation.

(2) Sample No. 1-2

Sample No. 1-2 was produced in the same manner as Sample No. 1-1, except for the following points.

For producing the sample, the ultraviolet rays irradiation process was not performed.

The condition of the temporary baking process was changed. The temporary baking process was performed after the drying process of the CSD coating film. Specifically, after placing the sample in the electric furnace, the temperature of the sample was increased to 600° C. at a temperature rising rage of 10° C. per minute under an oxygen atmosphere. The process was performed for 60 minutes at 600° C. In general, a heating process in this temperature range is referred to as "degrease." An organic component in the film being dried can be removed from inside the film.

After completing the temporary baking process (decrease), the main baking process was performed. Namely, each time one layer is formed, the temporary baking process and the main baking process was performed. After completing the temporary baking process, the temperature of the sample was increased to a temperature of the main baking process at a temperature rising rate of 10° C. per minute. After reaching the temperature of the main baking process, the sample was maintained at the temperature of the main baking process for 60 minutes, and the crystal growth was promoted.

After that, the temperature of the sample was decreased to 200° C., and the sample was taken out from the electric furnace. (When the baking process is performed by using a tubular furnace in which the atmosphere can be controlled, the cooling time tends to be longer, and the productivity may be lowered.)

Then, the CSD coating film forming process, the drying process, the temporary baking process, and the main baking process were repeated 20 times, and a complex oxide having a predetermined film thickness was obtained. Here, in order to repeat these operations 20 times, a processing time of several days was spent. The evaluation result is shown in Table 1.

(3) Sample No. 1-3

Sample No. 1-3 was produced in a same manner as Sample No. 1-2, except that the temperature rising rate in the baking process was set to 30° C. degrees per minute, and the temperature of the main baking process was set to 800° C. In this case, in order to repeat the operations 20 times, a processing time of several days was spent. The evaluation result is shown in Table 1.

(4) Sample No. 1-4

Sample No. 1-4 was produced in a same manner as Sample No. 1-1, except that, instead of the temporary baking process and the main baking process in the electric furnace, the temporary baking process and the main baking process

TABLE 1

| Sample No. | UV process | Temperature rising rate | Temperature of temporary baking process | Temperature of main baking process | Typical particle size [μm] | Evaluation |
| --- | --- | --- | --- | --- | --- | --- |
| 1-1 | Applied | 30° C./min | 800° C. | 1000° C. | 0.31 | ○ |
| 1-2 | Not applied | 10° C./min | 600° C. (Degrease) | 1000° C. | 0.29 | X |
| 1-3 | Not applied | 30° C./min | 800° C. | 1000° C. | 0.07 | X |
| 1-4 | Applied | 10° C./sec | 800° C. | 1000° C. | 0.39 | ○ |
| 1-5 | Applied | 10° C./sec | 1000° C. | 1000° C. | 0.66 | X | were performed as rapid thermal processing, and the temperature rising rate was set to 10° C. per second.

For the case of the rapid thermal processing, the temperature rising rate can be greater than that of the electric furnace. Accordingly, the processing time can further be reduced. When the temperature rising rate is greater, a temperature, at which a complex oxide formation reaction is started, can be quickly reached. Thus, a carbonate formation reaction can be suppressed. Further, since the rapid thermal processing is indirect heating caused by an effect of irradiation of light, an atmosphere of heating process can be easily controlled to be an oxygen atmosphere.

For producing Sample No. 1-4, the second repeating process was not performed. After repeating the processes from the CSD coating film forming process to the temporary baking process 10 times, the main baking process was performed, and producing of Sample No. 1-4 was completed. As a result, a thickness of a barium titanate film, which was the produced complex oxide, was 600 nm.

(5) Sample No. 1-5

Figure 10:
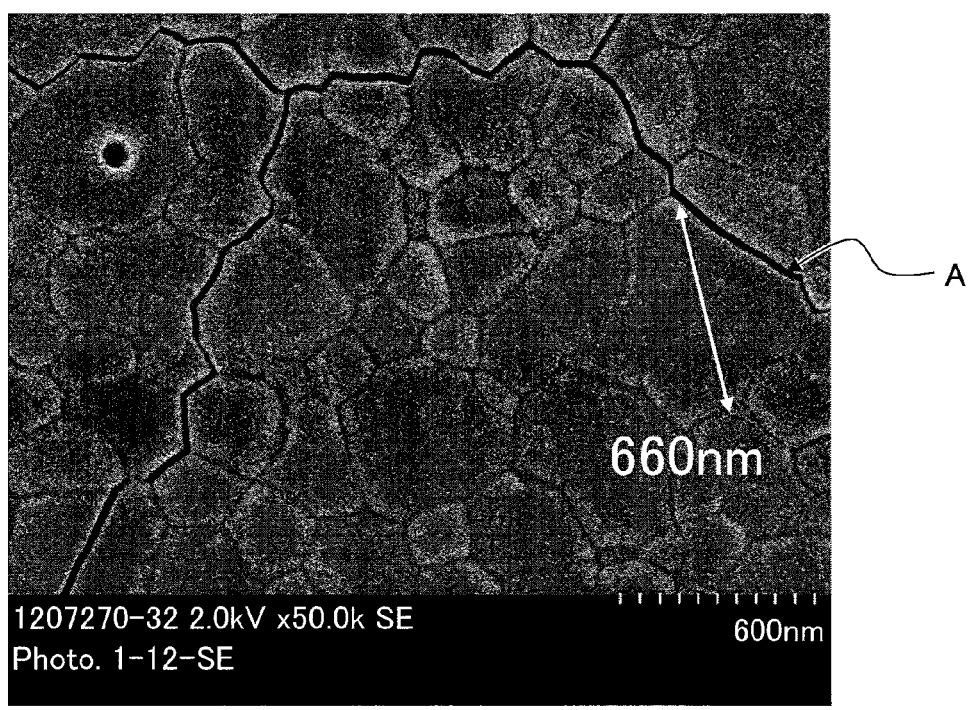
FIG. 10 shows a photomicrograph, by a scanning electron microscope (SEM), of Sample No. 1-5 in Experiment 1.

Sample No. 1-5 was produced in a same manner as Sample No. 1-4, except that the temperature of the temporary baking process was set to 1000° C. The result of the evaluation is shown in Table 1. FIG. 10 shows an image of Sample No. 1-5, which was observed by the SEM.

Among Samples No. 1-1 to No. 1-5 in the example of experiment, Samples No. 1-1 and No. 1-4 were the complex oxides according to the embodiment. It was confirmed that Samples No. 1-1 and No. 1-4 had the predetermined typical particle sizes, and crystal grains were sufficiently grown. For Sample No. 1-5, which was a comparative example, large crystal grains were formed such that the typical particle size was 0.66 μm. However, the film was damaged (cracked), and the film did not have sufficient dielectric characteristics. For Samples No. 1-2 and No. 1-3, which were comparative examples, the typical particle sizes were small, and growth of crystal grains was insufficient.

It has been known that the dielectric characteristics (e.g., relative permittivity and an electromechanical transducer coefficient) of barium titanate depend on a size of a crystal grain (e.g., Japanese Journal of Applied Physics 49 (2010) 09MC02). The above-described non-patent document discloses that, in the relationship between the crystal grain of barium titanate and its relative permittivity, the relative permittivity increases as the particle size of the crystal grain increases in a range of the particle size from 0.2 μm to 1 μm. The relative permittivity is plotted until the particle size of 0.3 μm, as a result of experiment. The result of experiment by the inventors agreed to this relationship.

Experiment 2

In this example of experiment, an effect of adding a sintering agent was studied.

In Experiment 2, a chemical reagent represented by Chemical Formula 4 was added to the starting material as a sintering agent.

$Ba_2B_2O_4$  (Chemical Formula 4)

Specifically, in the process of preparing the CSD solution (b), which is explained for Sample No. 1-1 of Experiment 1, the chemical compound represented by Chemical Formula 4 was added, so that an addition amount of the chemical compound was 0.5 mol % to 3 mol % relative to 1 mole of barium titanate. In this case, as shown in FIG. 8, diethoxybarium was used as a starting material of Ba, and triethoxyboron was used as a starting material of B.

Hereinafter, specific methods of producing corresponding samples are explained. Samples No. 2-1 to No. 2-3 are according to the embodiment. Samples No. 2-4 and No. 2-5 are comparative examples.

(1) Sample No. 2-1

Sample No. 2-1 was produced in a same manner as Sample No. 1-4 of Experiment 1, except that diethoxybarium and triethoxyboron were further added to the common solvent, so that concentration of $BaB_2O_4$ in the CSD solution was 0.5 mol %, and the temperature of the main baking process was set to 800° C. As explained for Sample No. 1-4 of Experiment 1, in the temporary baking process and the main baking process, heating was performed as the rapid thermal processing, and the temperature rising rate was set to 10° C. per second.

The obtained samples were evaluated similar to Experiment 1. The result of evaluation is shown in Table 2.

(2) Sample No. 2-2

Sample No. 2-2 was produced in a similar manner as Sample No. 2-1, except that diethoxybarium and triethoxyboron were added to the common solvent, so that concentration of $BaB_2O_4$ in the CSD solution was 2 mol %. The evaluation result is shown in Table 2.

Figure 11A:
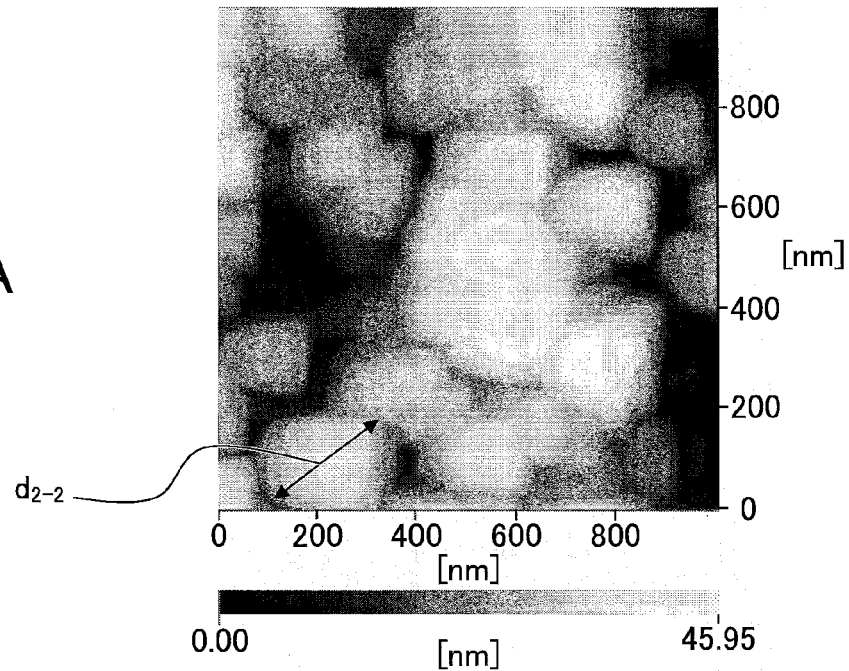
FIGS. 11A and 11B show images observed by using an atomic force microscope (AFM) of Sample No. 2-2 in Experiment 2.
Figure 11B:
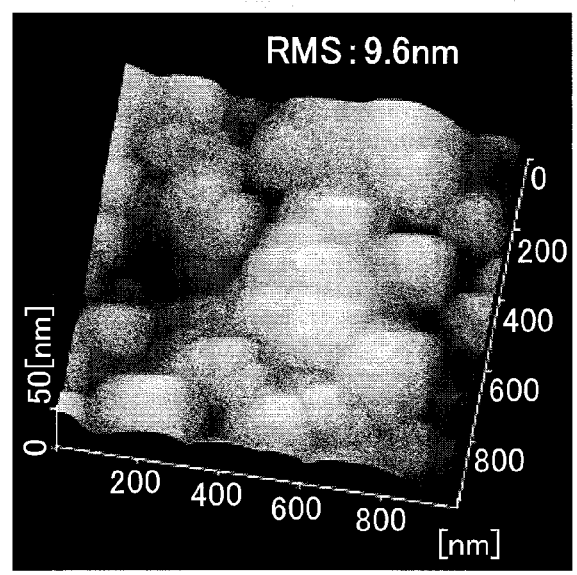

FIGS. 11A and 11B show images of Sample No. 2-2, which were observed by the AFM. The images were used for calculating the typical particle size of obtained Sample No. 2-2. The length indicated by $d_{2-2}$ in FIG. 11A is the typical particle size.

(3) Sample No. 2-3

Sample No. 2-3 was produced in a similar manner as Sample No. 2-1, except that diethoxybarium and triethoxyboron were added to the common solvent, so that concentration of $BaB_2O_4$ in the CSD solution was 3 mol %. The evaluation result is shown in Table 2.

(4) Sample No. 2-4

Figure 12:
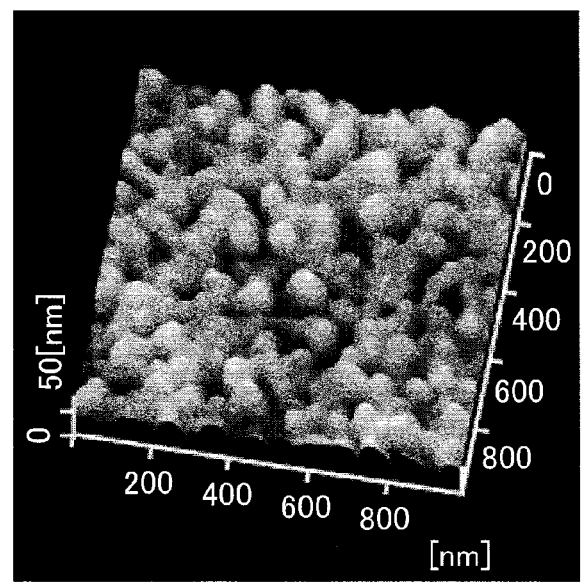
FIG. 12 shows an image observed by using the AFM of Sample No. 2-4 in Experiment 2.

For comparison purposes, Sample No. 2-4 was formed, so that the CSD solution did not include $BaB_2O_4$. Sample No. 2-4 was produced in a similar manner as Sample No. 2-1, except that diethoxybarium and triethoxyboron were not added to the common solvent. The evaluation result is shown in Table 2. FIG. 12 shows an image of Sample No. 2-4, which was observed by the AFM.

(5) Sample No. 2-5

Sample No. 2-5 was produced in a similar manner as Sample No. 2-2, except that temperature of the temporary baking process and the main baking process was set to 750° C. The evaluation result is shown in Table 2.

TABLE 2

| Sample No. | $BaB_2O_4$ concentration [mol %] | Temperature of temporary baking process [° C.] | Temperature of main baking process [° C.] | Typical particle size [μm] | Evaluation |
| --- | --- | --- | --- | --- | --- |
| 2-1 | 0.5 | 800 | 800 | 0.3 | ○ |
| 2-2 | 2 | 800 | 800 | 0.31 | ○ |
| 2-3 | 3 | 800 | 800 | 0.32 | ○ |
| 2-4 | 0 | 800 | 800 | 0.08 | x |
| 2-5 | 2 | 750 | 750 | 0.12 | x |

For Samples No. 2-1 to No. 2-3, which were according to the embodiment, the typical particle sizes were the predetermined typical particle size, despite that the temperature of the temporary baking process and the main baking process was lower than that of Experiment 1. It was confirmed that $BaB_2O_4$ has a high level of effectiveness as a sintering agent. As it can be clearly found by comparing FIG. 11B and FIG.

12, which show image of Samples No. 2-2 and No. 2-4 observed by the AFM, the typical particle size of Sample No. 2-2 is completely different from the typical particle size of Sample No. 2-4. The conditions of producing Samples No. 2-2 and No. 2-4 were the same, except for the presence or absence of the addition of $BaB_2O_4$.

In addition to above-described Samples No. 2-1 to No. 2-5, a sample was produced in a similar manner as Sample No. 2-1, except that diethoxybarium and triethoxyboron were added to the common solvent, so that concentration of $BaB_2O_4$ in the CSD solution was 4 mol %. However, when the obtained sample was observed by the SEM, the presence of grain boundaries was confirmed, and the dielectric characteristics was insufficient.

Experiment 3

In this example experiment, a sample was produced by the following procedure, and an electric strain characteristic of the sample was evaluated.

In this example experiment, a complex oxide film was formed on the first electrode film 41 which was formed on the substrate 44 through the adhesion layer and the TiOx layer in a similar manner as Sample No. 1-1 of Experiment 1, except that the second repeating process of (i) was repeated three times. Here, repeating three times the second repeating process of (i) means that the processes from the CSD coating film forming process to the main baking process were repeated 4 times in total. The processes from the CSD coating film forming process to the temporary baking process were repeated 40 times in total.

An upper electrode having a diameter of 100 microns was formed on the obtained complex oxide film by using a shadow mask and vapor deposition.

Figure 13:
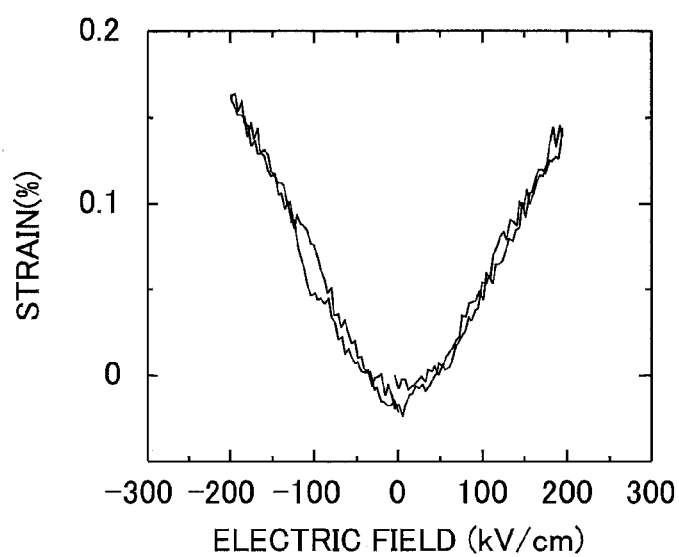
FIG. 13 shows a result of evaluating an electric strain characteristic in Experiment 3.

After that, a voltage was applied to the upper electrode, and at the same time, displacement of the barium titanate film, which was the complex oxide film, in a film thickness direction was measured by the AFM. In this manner, the electric strain characteristic of the barium titanate film was evaluated. FIG. 13 shows the result of the evaluation.

As shown in FIG. 13, when a value of the applied electric field is the maximum value (the positive maximum value), strain is 0.15%. The gradient of the line connecting the origin and this point (which is defined by the value of the applied electric field and the value of strain) is defined to be an electric strain coefficient (X33). For this sample, the value of X33 was 85 μm/V. For a negative electric field, the value of X33 was 94 μm/V (which was obtained from the maximum strain). It was confirmed that the sample had sufficient dielectric characteristics as an actuator.

Experiment 4

In this example experiment, the rate of change of capacitance caused by external bias voltage was evaluated.

Capacitance of Sample No. 1-4 of Experiment 1 was measured.

Figure 14:
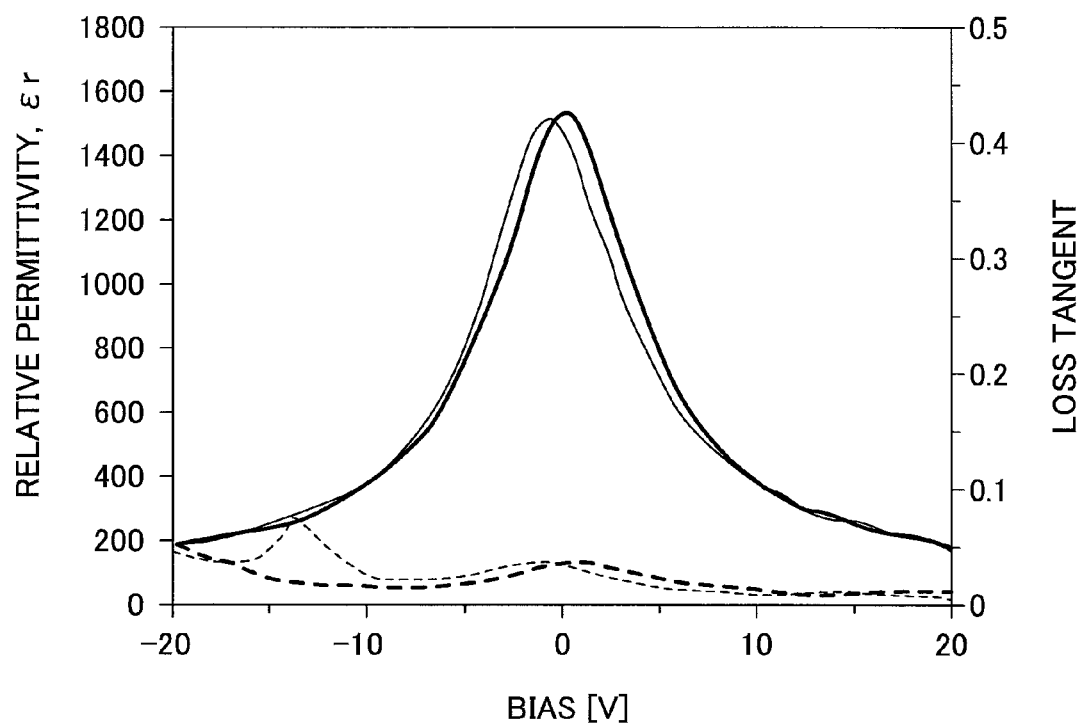
FIG. 14 shows a result of evaluating a tunable characteristic of a sample of Experiment 4.

The capacitance and dielectric loss were measured by an impedance analyzer (produced by Yokogawa-Hewlett-Packard Company, Model No. HP4194A), while setting the measurement frequency to 1 kHz, and the amplitude to 0.1 V. In order to measure the variation of the capacitance with respect to a DC bias voltage, the DC bias voltage was varied from −20 V to +20V. FIG. 14 shows the result of the measurement.

In FIG. 14, the thin solid line indicates the measured value of the relative permittivity, when the DC bias voltage was varied from −20 V to +20 V. The thin dashed line indicates the measured value of the loss tangent, when the DC bias voltage was varied from −20 V to +20 V. The thick solid line shows the measured value of the relative permittivity, when the DC bias voltage was varied from +20 V to −20V. The thick dashed line shows the measured value of the loss tangent, when the DC bias voltage was varied from +20 V to −20V. As it can be found in FIG. 14, the sample exhibits hysteresis, depending on the direction of the change of the DC bias voltage.

Performance of the tunable capacitor may be defined to be a ratio between the maximum capacitance (or the maximum relative permittivity) and the minimum capacitance (or the minimum relative permittivity) within the range of the external bias voltage. For this sample, the rate of change of capacitance was 72%. The sample exhibited better performance relative to a reported value (approximately 50%) in the past.

With this result, it is confirmed that the sample has sufficient dielectric characteristics as a variable capacitive element.

Hereinabove, the complex oxide having ferroelectricity, the thin-film capacitive element including the complex oxide, the liquid droplet discharge head including the thin-film capacitive element, and the method of producing the complex oxide are explained by the embodiment. However, the present invention is not limited to the embodiment, and variations and modifications may be made within the scope of the present invention. Specific examples of numerical values are used in order to facilitate understanding of the invention. However, these numerical values are simply illustrative, and any other appropriate values may be used, except as indicated otherwise.

The present application is based on and claims the benefit of priority of Japanese Priority Application No. 2013-050870 filed on Mar. 13, 2013, the entire contents of which are hereby incorporated herein by reference.

What is claimed is:
1. A complex oxide comprising:
    a chemical compound represented by $ABO_3$ (Chemical Formula 1), and
    a chemical compound represented by $BaB_2O_4$ (Chemical Formula 2),
    wherein in the Chemical Formula 1, A is one or more elements selected from Ba, Ca, and Sr; and B is one or more elements selected from Ti, Zr, Hf, and Sn, and in the Chemical Formula 2, B is one or more elements selected from Ti, Zr, Hf, and Sn,
    wherein the chemical compound represented by the Chemical Formula 2 is included in the chemical compound represented by the Chemical Formula 1, so that a ratio of an amount of the chemical compound represented by the Chemical Formula 2 with respect to that of the chemical compound represented by the Chemical Formula 1 is greater than or equal to 0.5 mol % and less than or equal to 3 mol %, and
    wherein, when a field having a size of 1 μm×1 μm on a surface of the complex oxide is observed with an atomic force microscope (AFM), a typical particle size is greater than or equal to 300 nm and less than 660 nm, wherein the typical particle size is a maximum length of a maximum particle observed in the field.
2. The complex oxide according to claim 1, wherein the A of the chemical compound represented by the Chemical Formula 1 includes Ba.

3. A thin-film capacitive element comprising:
a first electrode film;
a complex oxide thin-film formed on the first electrode film; and
a second electrode film formed on the complex oxide thin-film,
wherein the complex oxide thin-film is formed of a complex oxide,
wherein the complex oxide includes a chemical compound represented by $ABO_3$ (Chemical Formula 1), and
a chemical compound represented by $BaB_2O_4$ (Chemical Formula 2),
wherein in the Chemical Formula 1, A is one or more elements selected from Ba, Ca, and Sr; and B is one or more elements selected from Ti, Zr, Hf, and Sn, and in the Chemical Formula 2, B is one or more elements selected from Ti, Zr, Hf, and Sn,
wherein the chemical compound represented by the Chemical Formula 2 is included in the chemical compound represented by the Chemical Formula 1, so that a ratio of an amount of the chemical compound represented by the Chemical Formula 2 with respect to that of the chemical compound represented by the Chemical Formula 1 is greater than or equal to 0.5 mol % and less than or equal to 3 mol %, and
wherein, when a field having a size of 1 μm×1 μm on a surface of the complex oxide is observed with an atomic force microscope (AFM), a typical particle size is greater than or equal to 300 nm and less than 660 nm, wherein the typical particle size is a maximum length of a maximum particle observed in the field.

4. The thin-film capacitive element according to claim 3, wherein the thin-film capacitive element is a variable capacitive element.

5. The thin-film capacitive element according to claim 3, wherein the thin-film capacitive element is an electromechanical transducer element.

6. A liquid droplet discharge head comprising:
an electromechanical transducer element,
wherein the electromechanical transducer element includes
a first electrode film;
a complex oxide thin-film formed on the first electrode film; and
a second electrode film formed on the complex oxide thin-film,
wherein the complex oxide thin-film is formed of a complex oxide,
wherein the complex oxide includes
a chemical compound represented by $ABO_3$ (Chemical Formula 1), and
a chemical compound represented by $BaB_2O_4$ (Chemical Formula 2),
wherein in the Chemical Formula 1, A is one or more elements selected from Ba, Ca, and Sr; and B is one or more elements selected from Ti, Zr, Hf, and Sn, and in the Chemical Formula 2, B is one or more elements selected from Ti, Zr, Hf, and Sn,
wherein the chemical compound represented by the Chemical Formula 2 is included in the chemical compound represented by the Chemical Formula 1, so that a ratio of an amount of the chemical compound represented by the Chemical Formula 2 with respect to that of the chemical compound represented by the Chemical Formula 1 is greater than or equal to 0.5 mol % and less than or equal to 3 mol %, and
wherein, when a field having a size of 1 μm×1 μm on a surface of the complex oxide is observed with an atomic force microscope (AFM), a typical particle size is greater than or equal to 300 nm and less than 660 nm, wherein the typical particle size is a maximum length of a maximum particle observed in the field.

* * * * *